United States Patent [19]

Clements

[11] Patent Number: 4,897,708

[45] Date of Patent: Jan. 30, 1990

[54] SEMICONDUCTOR WAFER ARRAY

[75] Inventor: Ken Clements, Santa Cruz, Calif.

[73] Assignee: Laser Dynamics, Inc., Scotts Valley, Calif.

[21] Appl. No.: 887,129

[22] Filed: Jul. 17, 1986

[51] Int. Cl.4 .................... H01L 23/48; H01L 23/52
[52] U.S. Cl. ......................................... 357/65; 357/71
[58] Field of Search ..................... 357/65, 71, 75, 82, 357/68

[56] References Cited

U.S. PATENT DOCUMENTS

| | | |
|---|---|---|
| 2,627,545 | 2/1953 | Muss et al. |
| 2,734,154 | 2/1956 | Pankove . |
| 3,475,660 | 10/1969 | Coblenz . |
| 3,648,131 | 3/1972 | Stuby ................................ 357/68 X |
| 3,769,702 | 6/1974 | Scarbrough . |
| 3,813,773 | 6/1974 | Parks . |
| 3,867,759 | 2/1975 | Siefker . |
| 3,955,059 | 5/1976 | Graf ..................................... 200/181 |
| 4,037,246 | 7/1977 | Pellant et al. . |
| 4,074,342 | 2/1978 | Honn et al. ........................ 357/68 X |
| 4,129,881 | 12/1978 | Reichel et al. . |
| 4,158,118 | 6/1979 | Graf .................................. 200/187 X |
| 4,160,141 | 7/1979 | Graf .................................... 350/267 |
| 4,368,106 | 1/1983 | Anthony . |
| 4,394,712 | 7/1983 | Anthony . |
| 4,499,655 | 2/1985 | Anthony . |

Primary Examiner—Thomas H. Tarcza
Assistant Examiner—John B. Sotomayor
Attorney, Agent, or Firm—Fliesler, Dubb, Meyer & Lovejoy

[57] ABSTRACT

A wafer array comprising a plurality of wafers of semiconductor material are stacked one on top of another. Through holes are provided in the wafers and electrically conductive liquid is inserted in the through holes for interconnecting all of the wafers. The conductive liquid is electrically insulated from all parts of the wafers except a part comprising an electrically conductive bonding pad which provides an electrical path between the conductive liquid and transistors located in the wafers. The wafers, which are disposed in a stack one on top of the other, are mounted in an enclosure and coupled to electrical pin members for connection to external devices.

16 Claims, 1 Drawing Sheet

SEMICONDUCTOR WAFER ARRAY

BACKGROUND OF THE INVENTION

1. Field of the Invention

The present invention relates to semiconductor wafer arrays in general and in particular to a method and apparatus comprising a stacked array of semiconductor wafers which are interconnected by means of an electrically conductive liquid.

2. Description of the Prior Art

Since the development of integrated circuit technology, computers and computer storage devices have been made from wafers of semiconductor material comprising a plurality of integrated transistor circuits. After the wafer is made, the circuits are separated from each other by cutting the wafer into small chips. Thereafter, the chips are bonded to carriers of varying types, interconnected by tiny wires and packaged.

The above-described process of making computers and computer memory devices has been found to be time-consuming and costly and the use of tiny wires to electrically connect the chips has often been found to be unreliable. Moreover, the length of the wires which has been required to make the necessary interconnections between chips has been found to result in undesirable signal delays as the frequency of operation of the devices has increased.

To avoid some of the disadvantages of the prior technology, a number of efforts have been made to eliminate the need for separating chips in a wafer and interconnecting them using wires. For example, a technology called Wafer Scale Integration (WSI) attempted to do this. In WSI, techniques were used to wire together all the chips on a single wafer; however, the attempts thus far have not been successful. It was found that the line widths required to provide a computer on a single wafer, even when multiple layers of lateral connections were used, became so small that it was not possible to obtain lines of sufficient length and precision to make the necessary interconnections between the circuits therein.

The use of WSI technology which uses lateral connections to connect the circuits on a single wafer also has disadvantages when used for making storage devices. In practice, all wafers comprise randomly located defects. The defects render the circuits affected unusable. Since WSI technology incorporates the defective circuits at the time a wafer is made, it is difficult and costly to build in an amount of redundancy sufficient to overcome the effect of the defects. In any event, even if a single wafer comprising a large number of storage cells could be built at a reasonable cost, the memory capacity required in many applications far exceeds that which can be provided on a single wafer. Therefore, such applications would still require that a plurality of such wafers be used and that the wafers be interconnected in some suitable manner.

Other attempts to avoid the disadvantages of interconnecting a plurality of stacked wafers using wires have involved large scale parallel array processors and memory devices in which parallel circuit members are interconnected using vertical columns of solid, dense conductive material such as solder, copper, etc. For example, in U.S. Pat. No. 4,368,106, there is disclosed a process for making a solid, dense metallic feedthrough in a semiconductive material comprising the use of an electroforming solution and apparatus. In U.S. Pat. No. 4,394,712, there is disclosed a process for making a feedthrough in a semiconductor wafer array comprising three solid concentric materials including a central core of solder. In making the array, a plurality of the wafers are stacked and solder, which has been implanted in vias in the wafers and slightly beyond, is caused to flow, interconnecting the wafers.

The use of solid, dense feedthroughs to interconnect a plurality of wafers is typically costly and time consuming and makes it difficult to separate the wafers in the event that a wafer is or becomes defective and requires repair or replacement. The reason for this is that the heat required to form and/or sever the interconnections can be damaging to the wafers and the circuits located therein. Also, differential thermal coefficients of expansion between the rigid feedthroughs and the surrounding semiconductor and other materials can result in damaging stresses during thermal cycling.

SUMMARY OF THE INVENTION

In view of the foregoing, principal objects of the present invention are a method and apparatus comprising a semiconductor wafer array in which the individual wafers in the array are stacked one on top of another and interconnected using an electrically conductive liquid, such as mercury.

In accordance with the above objects, each wafer in the array is provided with one or more vias, as by chemical or laser drilling or the like. After the walls of the vias in the wafers are coated with a layer of electrically insulating material, the wafers are stacked one on top of another with the vias in one wafer placed in registration with corresponding vias in adjacent wafers and bonded together by means of an adhesive. At the same time, the wafers are bonded by means of the adhesive to a larger diameter interconnection wafer located at the bottom of the stack to form a wafer array.

The interconnection wafer comprises a plurality of pads which correspond in position to the vias in the wafers stacked thereon as well as electrically conductive traces which extend from the pads to corresponding pads located at the periphery thereof.

The array is then fitted with a jig for containing a supply of the electrically conductive liquid which overlies the vias at the top of the array and placed in a vacuum chamber. The chamber is evacuated to evacuate the vias. Thereafter, as the chamber is brought to atmospheric pressure, the liquid enters and fills the vias making electrical contract with a bonding pad located adjacent to each via and the pads on the interconnection wafer. Other surfaces of the wafers are electrically isolated from the liquid by the adhesive. After the array is removed from the chamber, the exposed ends of the vias are sealed with a compliant material. The array is then packaged with electrical connections made thereto by means of wires connecting pads on the interconnection wafer and externally projecting pin members.

BRIEF DESCRIPTION OF THE DRAWINGS

The above and other objects, features and advantages of the present invention will become apparent from the following detailed description of the accompanying drawings, in which.

DETAILED DESCRIPTION OF THE DRAWING

Referring to FIGS. 1–8, there is provided in accordance with the present invention a semiconductor wafer array designated generally as 1. In the array 1 there is provided a plurality of semiconductor wafers designated generally as 2. In each of the wafers 2 there is provided a plurality of integrated transistor circuits such as, for example, memory circuits (not shown). The transistor circuits are provided in the wafers in a conventional manner. On a surface 2a of each of the wafers 2 there is provided a plurality of electrical bonding pads 3. The bonding pads 3 are provided in a conventional manner for making electrical contract with selected portions of the transistor circuits in the wafers 2, as shown more clearly in FIG. 2.

Figure 1:
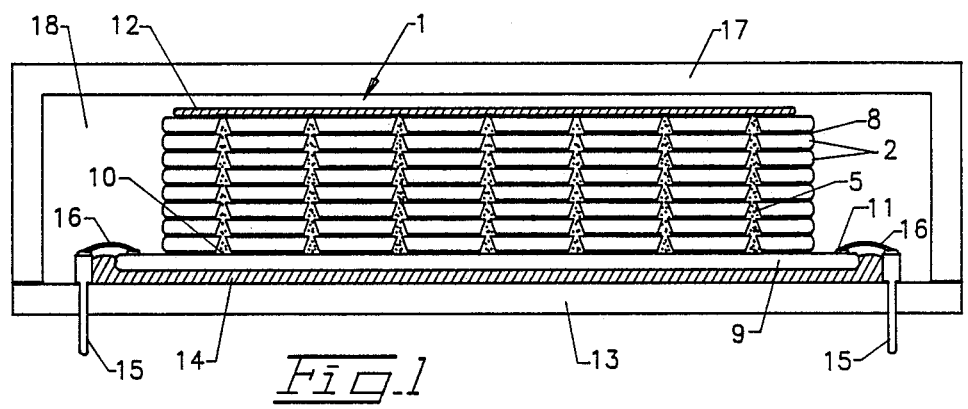
FIG. 1 is a cross-sectional view of a semiconductor wafer array according to the present invention.
Figure 2:
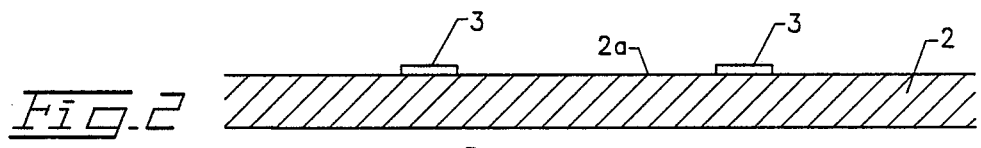
FIGS. 2–8 are partial cross-sectional views of portions of the array of FIG. 1 showing the principal steps involved in the fabrication of the array of FIG. 1.
Figure 3:
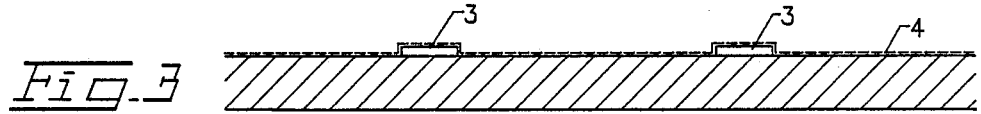
Figure 4:
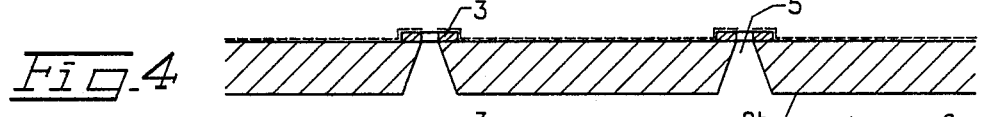
Figure 8:
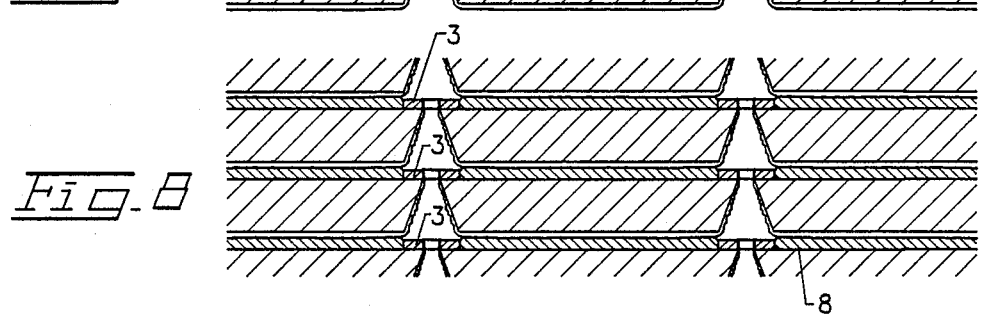

After the pads 3 are provided on the surface 2a of each of the wafers 2, the pads 3 and the surface 2a are covered with a protective layer 4, as shown in FIG. 3 by a broken line overlying the surface of the wafer 2 and the pads 3. The protective layer may comprise any suitable protective layer, such as a conventional photoresist which is applied in a conventional manner. After the pads 3 and surface 2a have been provided with the protective layer 4, the protected wafers are then drilled with a laser or etched chemically to produce a plurality of vias, i.e. through-holes, 5, as shown in FIG. 4. The number and location of the through-holes 5 in each wafer depends on the type of transistor circuits to be connected. However, in each case, the through-holes 5 extend generally through the center of each of the bonding pads and through each of the semiconductor wafers from the surface 2a to a backside surface 2b. Generally, the holes 5 are conically or pyramid shaped and are provided to be larger at the back surface 2b of the wafers than at the surface 2a so as to cover the pads 3 on an adjacent wafer when the wafers are stacked one on top of another, as shown in FIG. 8.

Figure 5:
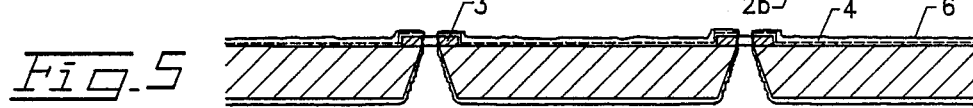

After the wafers have been drilled, they are cleaned and a further protective layer 6 is sprayed onto both sides of the wafers such that it provides a thin but continuous layer that is both chemically resistant and electrically insulating, as shown in FIG. 5. This layer is typically polyimide, which is sometimes used for insulating layers on IC wafers. The drawing is not to scale, but any thickness of polyimide above a few microns will be satisfactory, so long as it is not so large as to plug the through-holes 5. The polyimide layer 6 extends over all of the surface of the wafers 2, and the pads 3, except for a margin along the peripheral edges of the surface 2a. Leaving a margin of the surface 2a uncovered exposes the layer 4 to facilitate its subsequent removal, as further described below.

Figure 6:
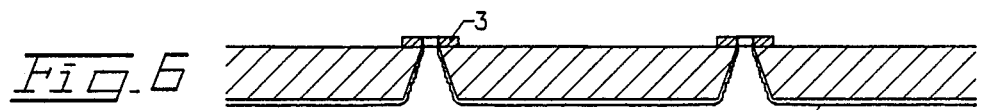
Figure 7:
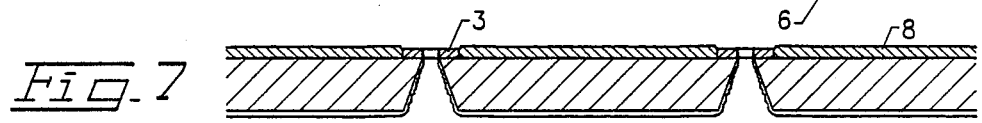

After each of the wafers 2 has been coated with polyimide or a functionally equivalent insulating material, the protective layer 4 and the polyimide layer 6 are removed from the surface 2a of the wafers 2 and the bonding pads 3. Typically, this is done by exposing the exposed margin of the wafers 2 to a solvent that dissolves the first protective layer 4. As the layer 4 is dissolved, it causes the layer 6 to lift off the surface 2a of the wafers, exposing the top surface of the bonding pads 3. At this point, the wafers 2 have through-holes 5 in the bonding pads and the remaining protective layer 6 remains over the walls of the through-holes 5 and the backside surface 2b, as shown in FIG. 6.

After the removal of the layers 4 and 6 from the surfaces 2a of the wafers 2 and the bonding pads 3, the exposed surfaces of the wafers 2 are provided with an adhesive, as by a roller, screen print, or other means, so as to provide a coating thick enough to compensate for any voids that may be present due to surface contour. Whatever means is chosen, it must insure that the adhesive does not flow into the through-holes or cover the top surface of the bonding pads when the wafers are stacked one on top of another. Alternatively, the adhesive 8 may be applied to the back surface 2b of the wafer 2.

The purpose of the adhesive is to hold the wafers in place when they are stacked one on top of another and also to prevent the leakage of a liquid conductor that is to be placed in the through-holes 5, as will be further described below. It is desirable that the adhesive fill the space between wafers so as to produce no voids. Techniques to achieve this are known in the adhesive art but it is not essential to the invention. The device will operate properly with some voids so long as said voids are too small to promote the cross-connection of liquid conductor columns.

For some applications, the thermal conductivity of the adhesive layer may be important. In these cases, this layer should be very thin and free of voids. A technique that can be used in such cases is to screen print the adhesive onto both the top and bottom sides of the wafers in layers a few microns thick. It is then possible, with the proper choice of adhesive, to cure the layers in what is known in the art as a "B" stage. A "B" stage is a stage which requires heat and/or pressure to create the bond and cure the adhesive.

After the adhesive 8 is provided on one of the surfaces of the wafers 2, the wafers are stacked one on top of the other in order to make the layered structure as shown in FIG. 8. An alignment of the through-holes 5 during stacking may be achieved by optical means as is common in IC mask aligning art, or by use of special through-holes which may be made large enough to accept alignment pins.

After the wafers are stacked, as shown in FIG. 8, they are mounted to a bottom interconnection wafer 9 by the same means used for attaching each of the other wafers. The wafer 9 is somewhat wider than the wafers 2, has interior pads in registration with corresponding through-holes in the wafers 2 and metal traces on its surface 10 which extend from the interior pads to exterior pads 11. The interior pads seal the base ends of the through-holes 5. The metal traces provide an electrical conductor between the interior pads and the exterior pads.

After the wafers 2 are stacked onto the wafer 9, leaving exposed the peripheral margins of the wafer 9 and the exterior pads 11 for external attachments, a jig (not shown) is placed on top of the array 1 and filled with a pool of electrically conductive liquid, such as mercury, which covers all of the through-holes 5. The array 1 together with the jig is then placed in a vacuum chamber. Thereafter, the vacuum chamber is evacuated to cause gases trapped in the through-holes 5 to bubble up through the liquid conductor pool. When the chamber is subsequently allowed to return to atmospheric pressure, the liquid conductor is drawn into the through-holes 5 and into contact with the interior pads on the wafer 9. The jig is then removed together with the excess liquid conductor. The top of the stack is then sealed by a compliant layer 12, such as RTV rubber, that closes the tops of the liquid conductor columns and yet provides for thermal expansion of the liquid without loss of seal. Preferably, the top layer of the stack is a "dummy" wafer as the liquid conductor may not have the proper area under the compliant layer to reach the top of said wafers' bonding pad areas.

After the stack is covered by the compliant sealing layer 12, the array 1 is mounted to a base plate 13 by means of a compliant adhesive 14. Bonding pads 11 on the interconnection wafer 9 are then connected to pin members 15 by wires 16. Thereafter, the assembly is covered by a cover member 17 which is mounted to the base 13. The space 18 within the cover 17 may then be filled, if necessary, with gases or fluids especially adapted for cooling the array 1.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, thereby enabling others skilled in the art to understand the invention for various embodiments and with various modifications as are suited to the particular use contemplated. For example, the through-holes 5 need not be tapered if a conductive material is deposited so as to make connection to the top surfaces of the bonding pads 3, and said material continues down the inside surface of the through-holes 5 where it will be in contact with the liquid conductor. This is an extra step that may be desirable in cases where the resistance from wafer to wafer must be as small as possible or in cases where the chemical nature of the liquid conductor would be damaging to the material used for the bonding pads.

It is also possible for the liquid conductor to be a form of plating solution that over time results in the formation of a metal film over the bonding pads 3 and the walls of the through-holes 5 so long as the plating solution remains active so as to re-plate any micro cracks that develop during temperature cycling.

In still another embodiment, a grown oxide layer may be used in place of the polyimide layer 6. In the case in which the through-holes are drilled by laser, this oxide layer can be grown on the inside walls of the through holes 5 by the presence of oxygen gas during the drilling.

For the foregoing reasons, it is intended that the scope of the invention be defined by the claims appended hereto and their equivalents.

What is claimed is:

1. A wafer array comprising:
a plurality of wafers of material which are disposed in a stack one on top of another;
a through-hole in each of said wafers in said stack, said through-hole having an apex at one surface of said wafer and a base at the opposite surface of said wafer with an outwardly sloping sidewall extending from said apex to said base.
first retaining means for retaining said through-hole in one of said wafers in said stack in registration with said through-hole in an adjacent wafer in said stack;
an electrically conductive pad located adjacent to said apex of said through-hole in each of said wafers, said base of said through-hole being large enough to extend over the electrically conductive pad located adjacent to said apex of a through-hole in registration therewith on an adjacent wafer;
an electrically conductive liquid which extends through said through-hole in each of said wafers for electrically connecting said electrically conductive pad on one of said wafers with said electrically conductive pad on said adjacent wafer;
means for electrically isolating said electrically conductive liquid from exposed surfaces of said wafer material; and
second and third retaining means located on the top and bottom of said stack, respectively for retaining said electrically conductive liquid in said throughholes, said third retaining means including means for electrically connecting said electrically conductive liquid to an external device.

2. An array according to claim 1 wherein each of said plurality of wafers comprises a transistor means and means for coupling said transistor means to said electrically conductive pad means.

3. An array according to claim 2 wherein said wafers comprise wafers of semiconductor material and said transistor means comprises integrated transistor circuit means.

4. An array according to claim 3 wherein said transistor means comprises a memory cell.

5. An array according to claim 1 wherein said through-hole comprises:
a cone-shaped through-hole.

6. An array according to claim 1 wherein said plurality of wafers comprises more than two of said wafers, said first retaining means comprises means for retaining said through-hole in each of said wafers in registration with said through-hole in said other wafers and said electrically conductive liquid extends through all of said through-holes in registration for electrically connecting said electrically conductive pads adjacent said through-holes on all of said wafers.

7. An array according to claim 1 wherein said first retaining means comprises an adhesive for adhesively attaching adjacent ones of said wafers to each other.

8. An array according to claim 1 wherein said electrically conductive liquid comprises mercury.

9. An array according to claim 1 wherein said isolating means comprises polyimide.

10. An array according to claim 1 wherein said isolating means comprises an oxide.

11. A wafer array comprising:
a stack of wafers of semiconductor material, each of said wafers having transistor means located therein and a through-hole extending through said wafer, said through-hole having an apex at one surface of said wafer and a base at the opposite surface of said wafer with an outwardly sloping sidewall extending from said apex to said base;
an electrically conductive pad located adjacent to said apex of said through-hole in each of said wafers, said base of said through-hole being large enough to extend over the electrically conductive pad located adjacent to said apex of a through-hole in registration therewith on an adjacent wafer, said electrically conductive pad on each of said wafers being electrically connected to said transistor means located therein; and means, including an electrically conductive liquid which extends through the through-hole in each of said wafers in said stack, for electrically interconnecting said electrically conductive pads adjacent to said through-holes in registration on all of said wafers.

12. A wafer array according to claim 11 comprising means for electrically isolating all surfaces of each of said wafers other than said electrically conductive pad from said electrically conductive liquid.

13. A wafer array according to claim 12 wherein said isolating means comprises a layer of electrically non-conductive material which covers the walls of each of said through-holes and said array further comprises a layer of electrically conductive material which overlays said layer of electrically non-conductive material in said through-hole and is in electrical contact with said electrically conductive pad adjacent to said through-hole for providing a lower resistance to current flow through said through-hole than is obtainable with said electrically conductive liquid alone.

14. A wafer array according to claim 11 comprising an interconnection wafer which is wider than said wafers in said stack and has an electrically conductive trace, one end of which is located in registration with a column of said through-holes and a second end of which is adapted to be electrically connected to a connecting member for electrically connecting said electrically conductive liquid to an external device.

15. A wafer array according to claim 14 wherein said interconnection wafer is located on one end of said stack and comprising means located on the opposite end of said stack for sealing said conductive liquid in said through-holes.

16. A method of making a wafer array comprising the steps of:
    providing a plurality of wafers, each of said wafers having an electrically conductive pad located on at least one surface thereof;
    coating said pad and the surface of said wafer surrounding said pad with a protective layer of material;
    providing a through-hole which extends through said protective layer of material, said pad and the wafer beneath said pad, said protective layer providing protection for the underlying wafer surface during said step of providing said through-hole;
    coating both sides of said wafer, said first protective layer and the walls of said through-hole with an electrically non-conductive layer;
    removing said protective layer and said electrically non-conductive layer covering said pad and said surface of said wafer surrounding said pad;
    coating at least one surface of each of said wafers with a non-electrically conductive adhesive for bonding one wafer to another after they have been placed in a stacked relationship;
    stacking said plurality of wafers one on top of another in such a manner that said through-hole in each of said wafers is in registration with said through-hole in the wafers adjacent thereto and said pad and the surfaces of said through-hole are kept free of said adhesive;
    attaching one end of the stacked wafers to an interconnection wafer, said interconnection wafer having an electrically conductive trace which extends from an exterior pad in registration with said through-holes to an exterior pad near the periphery thereof;
    placing a supply of electrically conductive liquid on the opposite end of said stack over said through-holes;
    placing said stack with said interconnection wafer and said supply of electrically conductive liquid in a vacuum chamber;
    evacuating said chamber so as to evacuate said through-holes;
    allowing said chamber to recover to atmospheric pressure after said through-holes have been evacuated so as to cause said electrically conductive liquid to migrate into said evacuated through-holes;
    covering said stack with a material for retaining said electrically conductive liquid in said through-holes;
    mounting said stack in a case on a layer of compliant material; and
    attaching said external pad on said periphery of said interconnection wafer to an electrical pin member which extends through a wall of said case for providing a means for electrically connecting said stack to an external device.

* * * * *

UNITED STATES PATENT AND TRADEMARK OFFICE
CERTIFICATE OF CORRECTION

PATENT NO. : 4,897,708

DATED : January 30, 1990

INVENTOR(S) : KEN CLEMENTS

It is certified that error appears in the above-identified patent and that said Letters Patent is hereby corrected as shown below:

Column 6, line 22, delete the period (.) after "means".
line 24, after "pad" delete "means".

Signed and Sealed this

Twenty-seventh Day of November, 1990

Attest:

HARRY F. MANBECK, JR.

Attesting Officer

Commissioner of Patents and Trademarks